(12) United States Patent
Barowski et al.

(10) Patent No.: US 10,333,508 B2
(45) Date of Patent: *Jun. 25, 2019

(54) CROSS BAR SWITCH STRUCTURE FOR HIGHLY CONGESTED ENVIRONMENTS

(71) Applicant: INTERNATIONAL BUSINESS MACHINES CORPORATION, Armonk, NY (US)

(72) Inventors: Harry Barowski, Boeblingen (DE); Kurt Lind, Tuebingen (DE); Friedrich Schroeder, Stuttgart (DE)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 70 days.

This patent is subject to a terminal disclaimer.

(21) Appl. No.: 15/472,460

(22) Filed: Mar. 29, 2017

(65) Prior Publication Data
US 2018/0287598 A1    Oct. 4, 2018

(51) Int. Cl.
*G06F 17/50* (2006.01)
*H03K 17/00* (2006.01)
*H04L 12/933* (2013.01)
*H04Q 1/28* (2006.01)
(Continued)

(52) U.S. Cl.
CPC ....... *H03K 17/002* (2013.01); *G06F 17/5072* (2013.01); *G06F 17/5077* (2013.01); *H04L 49/101* (2013.01); *H04Q 1/28* (2013.01); *H04Q 3/00* (2013.01); *H04Q 3/521* (2013.01)

(58) Field of Classification Search
USPC ......... 716/100–101, 116–118, 121, 126–128
See application file for complete search history.

(56) References Cited

U.S. PATENT DOCUMENTS 5,452,231 A * 9/1995 Butts .................. G06F 17/5027
326/38
6,018,523 A    1/2000 Even
6,185,220 B1  2/2001 Muthukrishnan et al.
(Continued)

OTHER PUBLICATIONS

Wu et al., A 2Gb/s 256*256 CMOS Crossbar Switch Fabric Core Design using Pipelined MUZ, IEEE, pp. 568-571 (Year: 2002).*
(Continued)

*Primary Examiner* — Nghia M Doan
(74) *Attorney, Agent, or Firm* — Margaret McNamara, Esq.; Kevin P. Radigan, Esq.; Heslin Rothenberg Farley & Mesiti P.C.

(57) ABSTRACT

A semiconductor circuit is provided having a crossbar switch arrangement, which includes at least one multiplexer, an output of which corresponds to an output of the crossbar switch arrangement. The arrangement also includes: a set of input lines connected to data inputs of the multiplexer, the input lines extending along a first direction of the semiconductor circuit; and a set of select lines connected to select inputs of the multiplexer, the select lines extending along a second direction of the semiconductor circuit, where the second direction differs from the first direction. The multiplexer includes at least one multiplexing circuit for generating a multiplexed signal from signals present at the input lines and at least one primary output driver for generating an output signal from the multiplexed signal.

20 Claims, 9 Drawing Sheets

(51) Int. Cl.
*H04Q 3/52* (2006.01)
*H04Q 3/00* (2006.01)

(56) References Cited

U.S. PATENT DOCUMENTS

| | | | |
|---|---|---|---|
| 6,289,494 B1 | 9/2001 | Sample et al. | |
| 6,557,070 B1 | 4/2003 | Noel, Jr. | |
| 6,710,623 B1 * | 3/2004 | Jones | H03K 19/17736 326/38 |
| 7,139,292 B1 | 11/2006 | Evans et al. | |
| 7,149,996 B1 | 12/2006 | Lysaght et al. | |
| 7,925,816 B2 | 4/2011 | Olesinski et al. | |
| 8,082,526 B2 | 12/2011 | Hutton et al. | |
| 8,098,081 B1 | 1/2012 | Trimberger | |
| 8,493,090 B1 | 7/2013 | Trimberger | |
| 8,583,850 B2 | 11/2013 | Masleid et al. | |
| 8,704,408 B2 | 4/2014 | Becker et al. | |
| 8,898,611 B2 | 11/2014 | Konda | |
| 9,077,338 B1 | 7/2015 | Schulz et al. | |
| 9,157,952 B2 | 10/2015 | Becker et al. | |
| 9,183,344 B2 | 11/2015 | Teig et al. | |
| 9,203,739 B2 | 12/2015 | Beecroft | |
| 9,817,933 B2 | 11/2017 | Wang et al. | |
| 9,906,225 B2 | 2/2018 | Wang | |
| 9,929,979 B2 | 3/2018 | St. Germain | |
| 10,169,511 B2 * | 1/2019 | Lind | G06F 17/505 |
| 2003/0077025 A1 | 4/2003 | Zhang et al. | |
| 2003/0233508 A1 | 12/2003 | Bosshart | |
| 2005/0206536 A1 | 9/2005 | Holberg et al. | |
| 2007/0076824 A1 | 4/2007 | Graef | |
| 2008/0143379 A1 | 6/2008 | Norman | |
| 2008/0285449 A1 | 11/2008 | Larsson et al. | |
| 2010/0058261 A1 | 3/2010 | Markov et al. | |
| 2011/0090905 A1 | 4/2011 | Mueller et al. | |
| 2012/0047310 A1 | 2/2012 | Satpathy et al. | |
| 2012/0262009 A1 | 10/2012 | Becker et al. | |
| 2013/0086537 A1 | 4/2013 | Alpert et al. | |
| 2013/0311697 A1 | 11/2013 | Abel et al. | |
| 2014/0156929 A1 | 6/2014 | Falsafi et al. | |
| 2014/0198631 A1 | 7/2014 | Cavanna et al. | |
| 2014/0247825 A1 | 9/2014 | Rao et al. | |
| 2014/0376557 A1 | 12/2014 | Park et al. | |
| 2015/0046895 A1 | 2/2015 | Konda | |
| 2015/0063348 A1 | 3/2015 | Chrysos et al. | |
| 2015/0146569 A1 | 5/2015 | Rauh | |
| 2015/0244647 A1 | 8/2015 | Gopalan et al. | |
| 2016/0380629 A1 | 12/2016 | Chen et al. | |
| 2017/0063625 A1 | 3/2017 | Philip et al. | |
| 2017/0180510 A1 | 6/2017 | Mau et al. | |
| 2017/0206959 A1 | 7/2017 | Jeon | |
| 2017/0256587 A1 | 9/2017 | Tsuji et al. | |
| 2017/0289063 A1 | 10/2017 | Adler et al. | |
| 2018/0095930 A1 | 4/2018 | Lu et al. | |

OTHER PUBLICATIONS

Hoo, et al., "An Area-Efficient Partially Reconfigurable Crossbar Switch with Low Reconfiguration Delay", 2012 22nd International Conference on Field Programmable Logic and Applications (FPL), Aug. 29-31, 2012 (7 pages).

Tsai et al, "Routability Optimization for Crossbar-Switch Structured ASIC Design", ACM Transactions on Design Automation of Electronic Systems, vol. 18, No. 3, Article 39, Pub date: Jul. 2013 (28 pages).

Lee, et al., "A 256-Radix Crossbar Switch Using Mux-Matrix-Mux Folded-Clos Topology", Journal of Semiconductor Technology and Science, vol. 14, No. 6, Dec. 2014 (8 pages).

Sahin, Devrim, "A Locality Preserving One-Sided Binary Tree-Crossbar Switch Wiring Design Algorithm", 2015 49th Annual Conference on Information Sciences and Systems (CISS), Mar. 18-20, 2015, (4 pages).

International Business Machines Corporation (IBM), "z/Architecture Principles of Operation," IBM® Publication No. SA22-7832-10, Eleventh Edition, Mar. 2015, pp. 1-1732.

International Business Machines Corporation (IBM), "Power ISA™ Version 2.07B," International Business Machines Corporation, Apr. 9, 2015, pp. 1-1527.

Lind et al., "Method to Synthesize a Cross Bar Switch in a Highly Congested Environment", U.S. Appl. No. 15/472,441, filed Mar. 29, 2017 (36 pages).

Barowski et al., "List of IBM Patents and/or Patent Applications Treated as Related", U.S. Appl. No. 15/472,460, filed Mar. 29, 2017, dated Mar. 29, 2017 (2 pages).

Passas et al., "A 128×128×24gB/S Crossbar Interconnecting 128 tiles in a single hop and Occupying 6% of their area", ACM/IEEE Proceeding of the 4th Int. Symposium on Networks on Chip—NOCS 2010 (May 2010).

* cited by examiner

CROSS BAR SWITCH STRUCTURE FOR HIGHLY CONGESTED ENVIRONMENTS

BACKGROUND

The disclosure relates to a semiconductor circuit which includes a crossbar switch arrangement and to a method for generating a semiconductor design of a crossbar switch arrangement.

With each new technology generation, building crossbar switch arrangements becomes more difficult. As transistor and structure sizes shrink the wire quality decreases. Thus, it is more difficult to provide a proper design for routing and complying with timing requirements.

SUMMARY

According to one or more aspects of the present invention, a semiconductor circuit is provided which includes a crossbar switch arrangement. The crossbar switch arrangement includes at least one multiplexer, a set of input lines connected to data inputs of the multiplexer, and a set of select lines connected to select inputs of the multiplexer. An output of the at least one multiplexer corresponds to an output of the crossbar switch arrangement. The input lines extend along a first direction of the semiconductor circuit, and the select lines extend along a second direction of the semiconductor circuit, where the second direction differs from the first direction. Further, the multiplexer includes at least one multiplexing circuit for generating a multiplexed signal from signals present at the input lines and at least one primary output driver for generating an output signal from the multiplexed signal.

Design methods, computer program products and systems relating to one or more aspects disclosed herein are also described and claimed herein. Further, services relating to one or more aspects are also described and may be claimed herein.

Additional features and advantages are realized through the techniques of the present invention. Other embodiments and aspects are described in detail herein and are considered a part of the claimed aspects.

DESCRIPTION OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Figure 1:
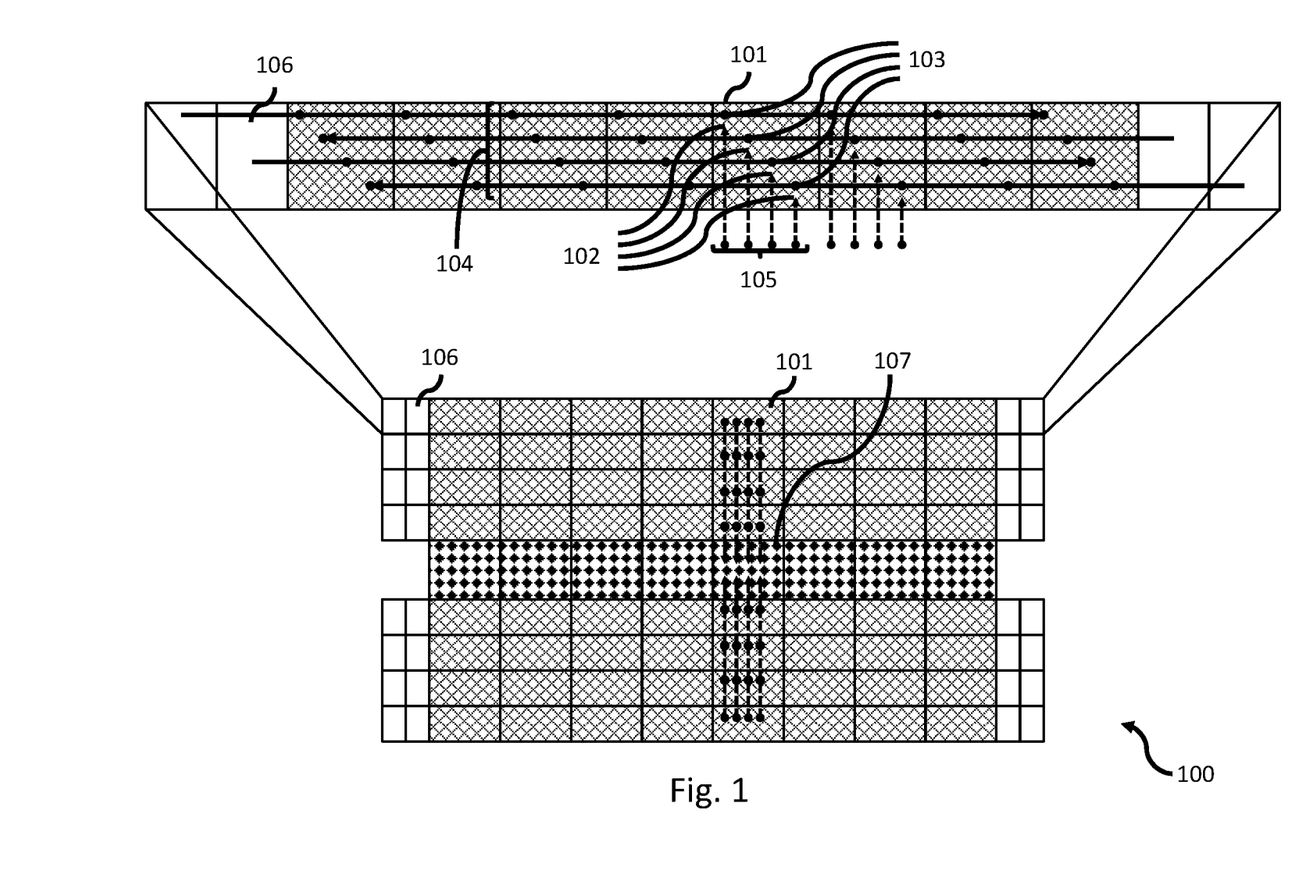
FIG. 1 shows an exemplary crossbar switch arrangement, in accordance with one or more aspects of the present invention.

FIG. 1 shows a first exemplary crossbar switch arrangement 100 of a semiconductor circuit. The crossbar switch arrangement 100 includes multiple multiplexers 101 shown with a crosshatched pattern. The multiplexers each include a multiplexing circuit having a number of data inputs 103, which may be called depth of the multiplexing circuit, and one output as well as a primary output driver. The outputs of the multiplexing circuits correspond to the outputs of the crossbar switch arrangement 101.

Furthermore, the multiplexing circuit includes a number of select inputs 102 for selecting which data input 103 is to be connected to the output of the multiplexing circuit 101. The number of select inputs 102 corresponds to the number of data inputs 103.

A set of input lines 104 is connected to the data inputs 103 of the multiplexing circuits, which extend along a first direction of the semiconductor circuit 100, e.g. horizontally, as shown in FIG. 1. The first input line may be connected to the first data inputs of the multiplexing circuits, the second input line may be connected to the second inputs of the multiplexing circuits, etc.

Moreover, a set of select lines 105 are provided extending along a second direction of the semiconductor circuit 100, e.g., vertically as shown in FIG. 1. The first select line may be connected to the first select inputs of multiplexing circuits in a column, the second select line may be connected to the second select inputs of the multiplexing circuits in a column etc.

Input drivers 106 for driving the input data via the input lines 104 to the multiplexers 101 are provided at the edge of each row. Thus, it is convenient to access the input drivers 106 and provide the data signals to the crossbar switch arrangement.

Moreover, arranging the multiplexers in column and rows allows for a well structured wiring of the timing critical input and select lines. The crossbar switch arrangement 100 further includes select drivers 107 provided in the center of two groups of multiplexer rows. Providing the select drivers 107 in the center allows for keeping the select lines 105 shorter and reducing the risk of timing problems.

Each of the multiplexer rows may correspond to a bit bay area, wherein each bit bay area includes two power supply rails.

Figure 2:
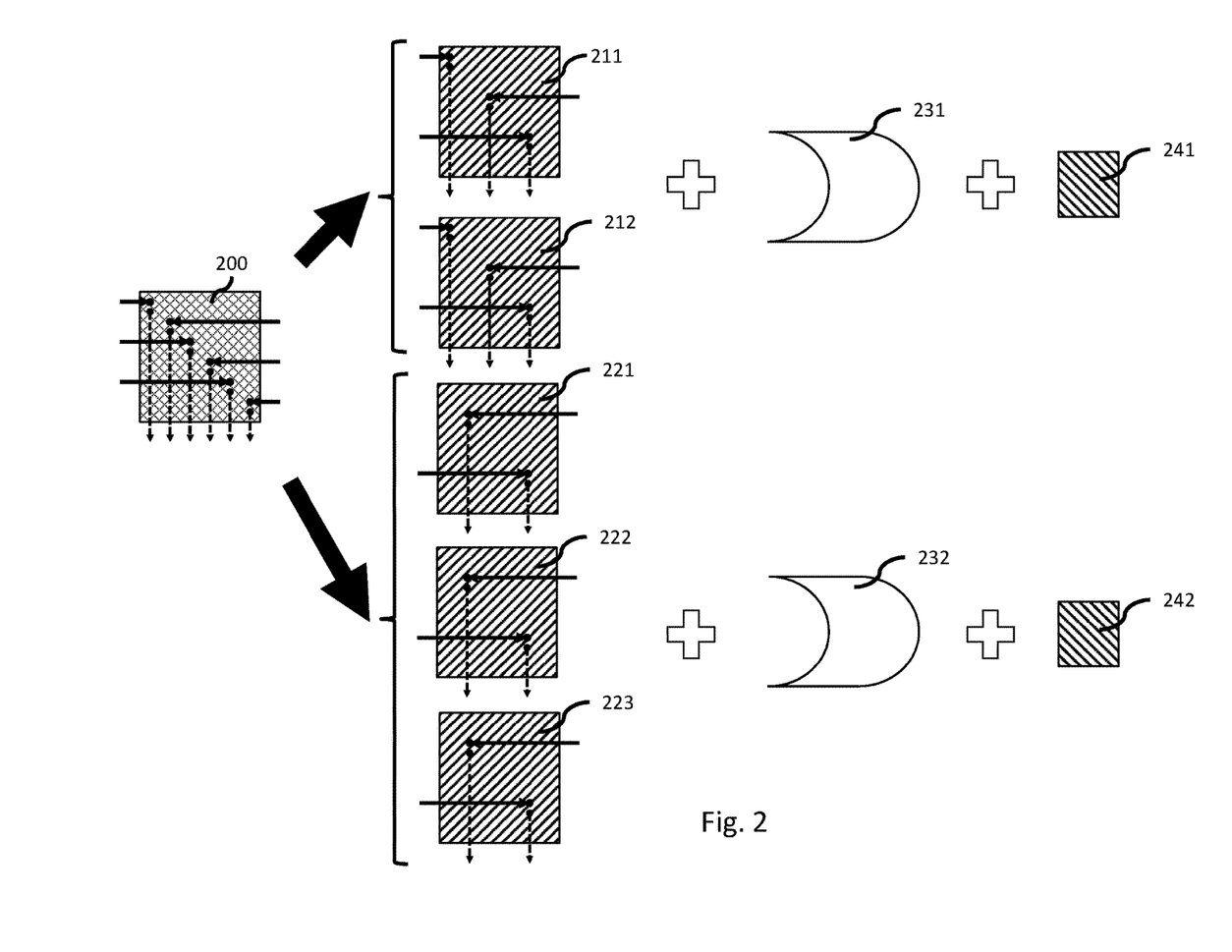
FIG. 2 illustrates one embodiment of splitting multiplexers, in accordance with one or more aspects of the present invention.
Figure 3:
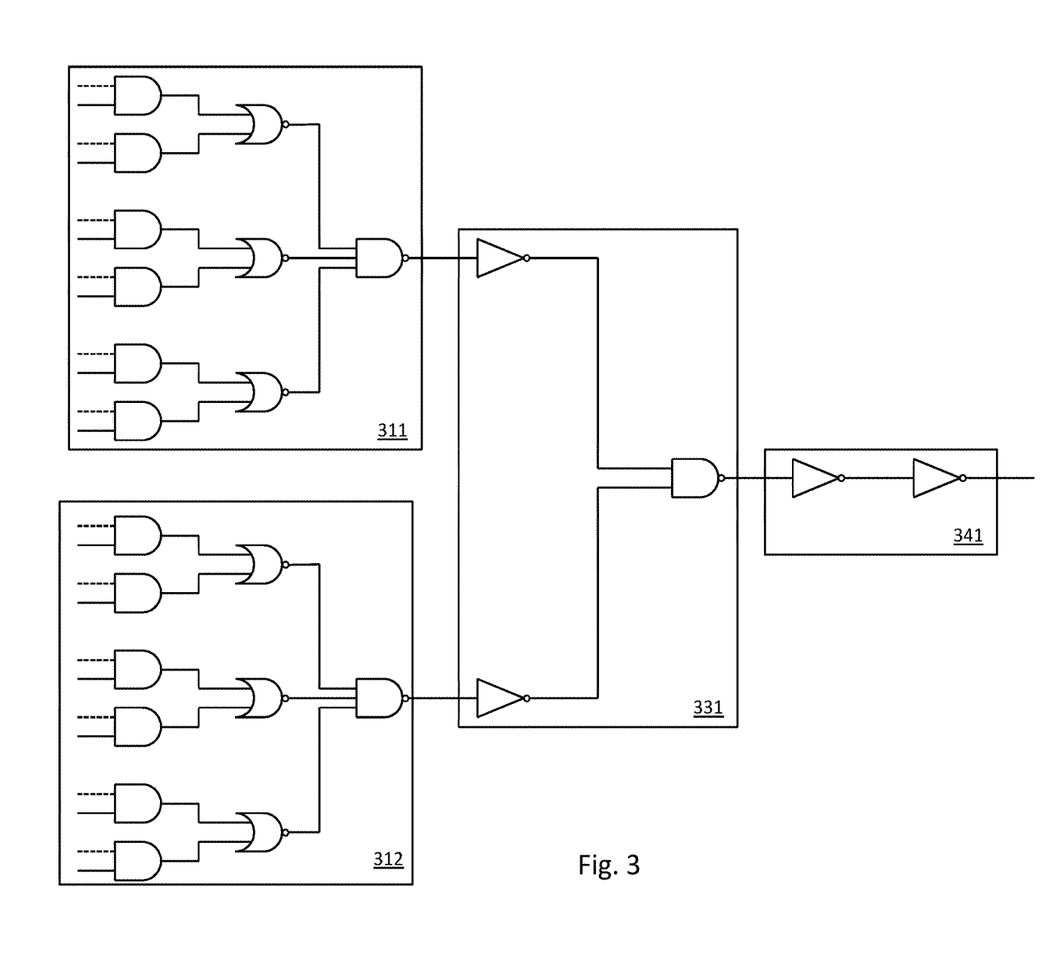
FIG. 3 illustrates another embodiment of splitting multiplexers, in accordance with one or more aspects of the present invention.

FIGS. 2 and 3 show examples for replacing one larger multiplexer 200 with two smaller multiplexers 211, 212; 311, 312 or three smaller multiplexers 221, 222, 223.

For example, the multiplexer 200 may include a multiplexing circuit having six data inputs and six select inputs as well as a primary output driver. This multiplexer 200 may be replaced by two multiplexing circuits 211, 212 each having three data inputs and three select inputs, an OR-circuit 231 for combining the outputs of the two multiplexing circuits 211, 212 as well as a primary output driver 241. The multiplexing circuits 211, 212 are indicated with a hatched pattern from lower left to upper right. The primary output driver 241 is indicated with a hatched pattern from upper left to lower right. A multiplexer, e.g. the multiplexer 200, including a multiplexing circuit and a primary output driver is correspondingly indicated with a crosshatched pattern.

In another example, the multiplexer 200 may be replaced by three multiplexing circuits 221, 222, 223 each having two data inputs and two data inputs, an OR-circuit 232 for combining the outputs of the three multiplexing circuits 221, 222, 223 as well as a primary output driver 242.

FIG. 3 shows in a little bit more detail two multiplexing circuits 311, 312 each including six data inputs (continues lines) and six select inputs (dotted lines), an OR-circuit 331 as well as a primary output driver 341.

Figure 4:
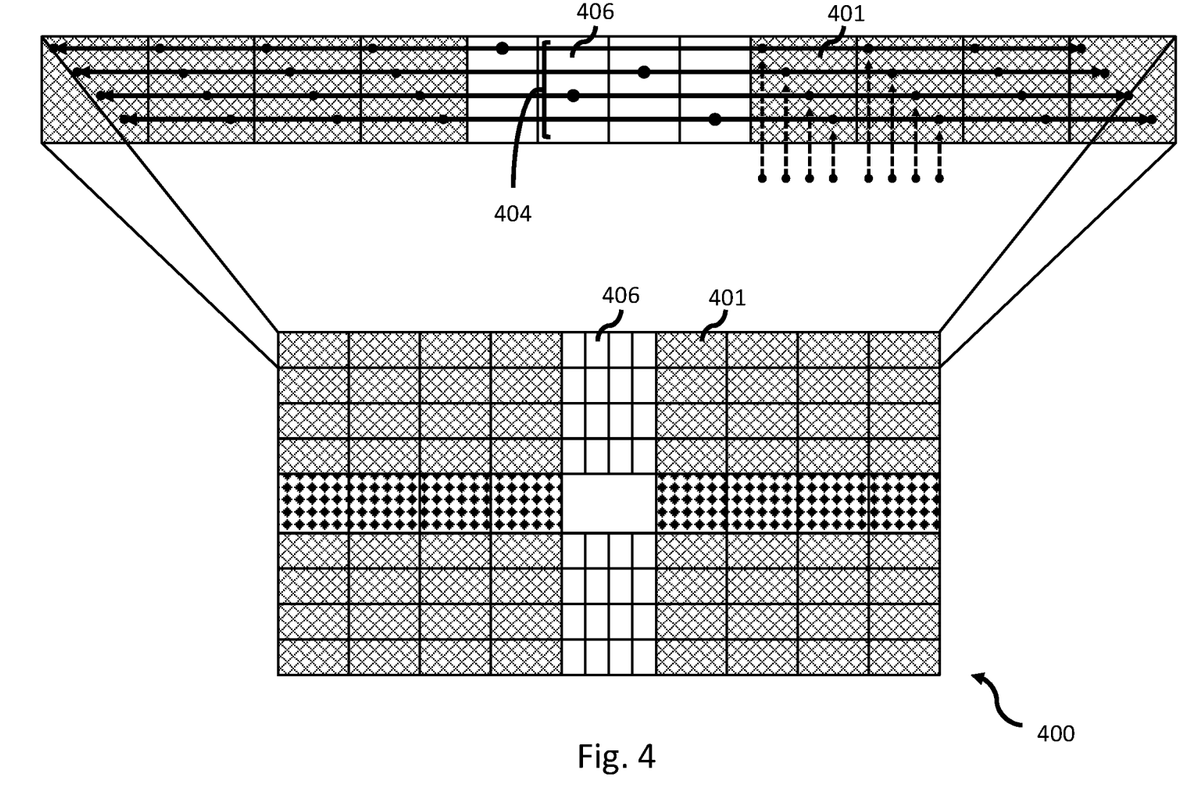
FIG. 4 shows a further exemplary crossbar switch arrangement, in accordance with one or more aspects of the present invention.

FIG. 4 shows a second exemplary crossbar switch arrangement 400, which differs from the first exemplary crossbar switch arrangement shown in FIG. 1 in that the input drivers 406 for driving the input lines 404 are located in an inner area of the crossbar switch arrangement 400 and the multiplexers 401 are located at an outer area of the crossbar switch arrangement 400. Hence, the length of the input lines 404 from the input drivers 406 to the respective farthest multiplexer 401 is reduced. This may result in a decreased wire delay of the input lines 404 and reduce the risk of timing problems.

Figure 5:
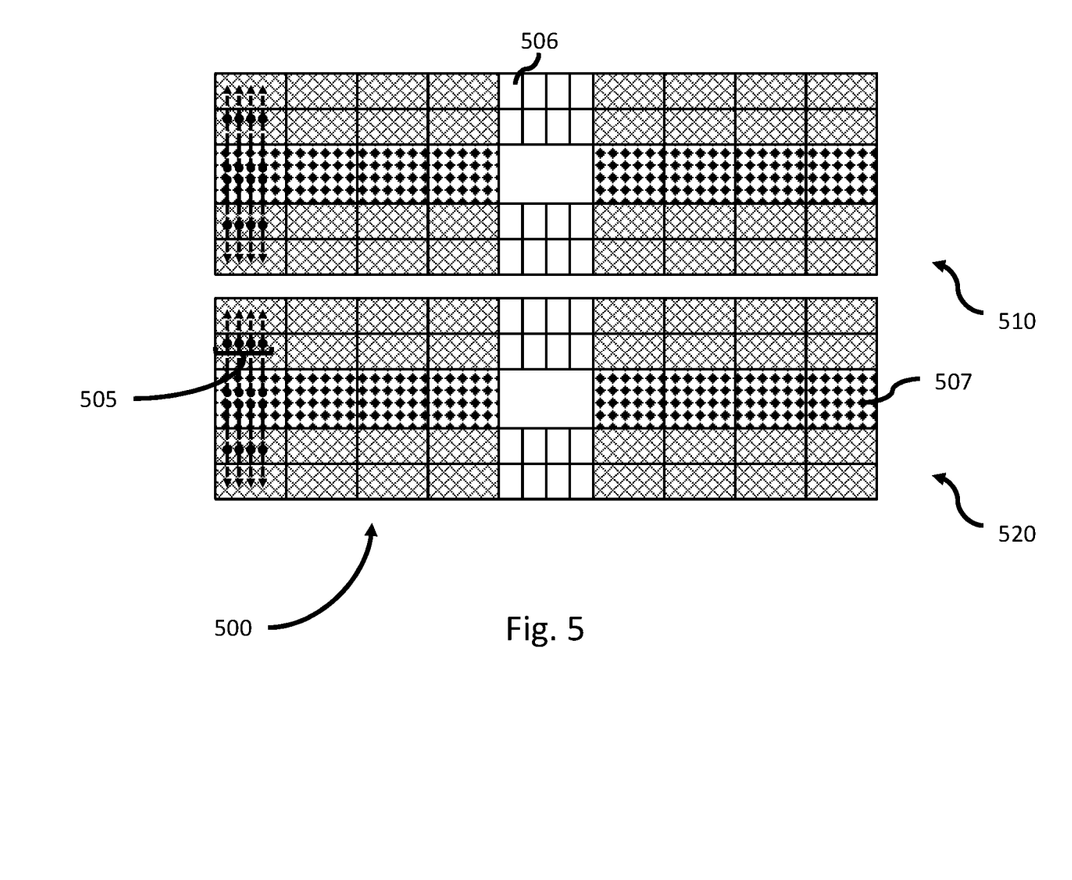
FIG. 5 shows another exemplary crossbar switch arrangement, in accordance with one or more aspects of the present invention.

FIG. 5 illustrates a third exemplary crossbar switch arrangement 500. The crossbar switch arrangement 500 differs from the crossbar switch arrangements 100 and 400 shown in FIGS. 1 and 4 in that the number of multiplexers addressed by each of the select lines 505 is reduced. Thus, wire delay of the select lines 505 and the risk of associated timing problems may be reduced. In the example shown in FIG. 5, the crossbar switch arrangement 500 is divided in two sub crossbar switch arrangements 510 and 520. The crossbar switch arrangement 500 may also be divided in more than two sub crossbar switch arrangements. Due to the division, the number of select drivers is increased. According to the exemplary crossbar switch arrangement 500, the data drivers 506 are provided centrally. However, it is also possible to image a crossbar switch arrangement with sub crossbar switch arrangements, wherein the data drivers are provided at the edges like in the example shown in FIG. 1.

Figure 6:
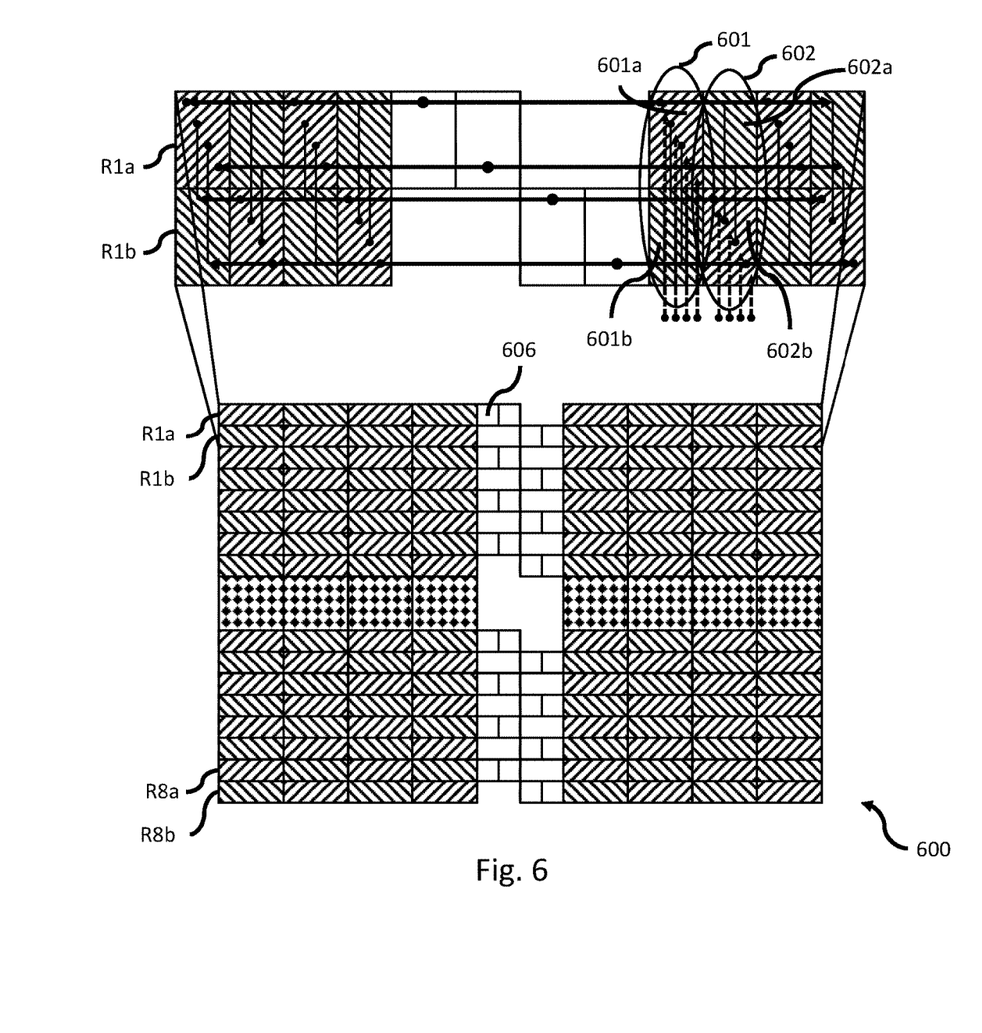
FIG. 6 shows another exemplary crossbar switch arrangement, in accordance with one or more aspects of the present invention.

FIG. 6 shows a fourth exemplary crossbar switch arrangement 600. The crossbar switch arrangement 600 includes eight times two adjacent bit bay areas R1a, R1b, R8a, R8b, wherein each bit bay area includes two power supply rails. The multiplexer 601 includes two multiplexer areas 601a and 601b, which are located in the adjacent bit bay areas R1a and R1b. The multiplexer area 601a includes a multiplexing circuit (hatched pattern from lower left to upper right) having a number of data inputs and a number of select inputs and the multiplexer area 601b includes a primary output driver (hatched pattern from upper left to lower right).

The multiplexer 602 next to the multiplexer 601 also includes two multiplexer areas 602a and 602b, which are located in the adjacent bit bay areas R1a and R1b. However, the multiplexer area 602a includes the primary output driver (hatched pattern from upper left to lower right) and the multiplexer area 602b includes the multiplexing circuit (hatched pattern from lower left to upper right). Thus, the multiplexer areas including the multiplexing circuits of neighboring multiplexers are located space apart from each other. This arrangement may also be called interleaving. It may result in a checkerboard pattern. Using multiplexers having two multiplexer areas in adjacent bit bay areas may allow for a reduced data line density and, accordingly, larger data lines. In case, multiplexing circuits of adjacent multiplexer are space apart from each other, the distance between adjacent signal lines and the physical width of the crossbar switch arrangement may be reduced. In addition, such an arrangement may allow for shorter input lines reducing the risk of timing problems when inputting data into the data inputs of the multiplexers.

Figure 7A:
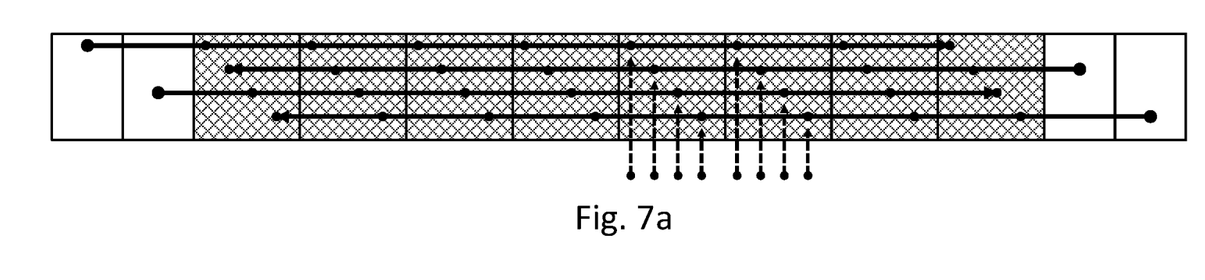
FIGS. 7a-7c illustrate for comparison three exemplary crossbar switch arrangements, in accordance with one or more aspects of the present invention.
Figure 7B:
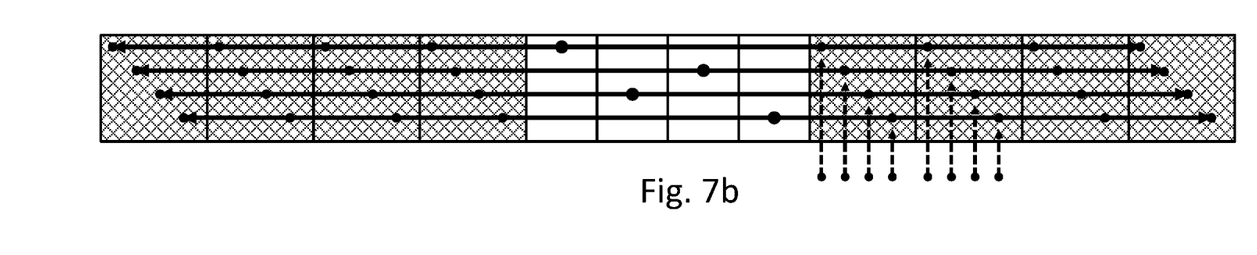
Figure 7C:
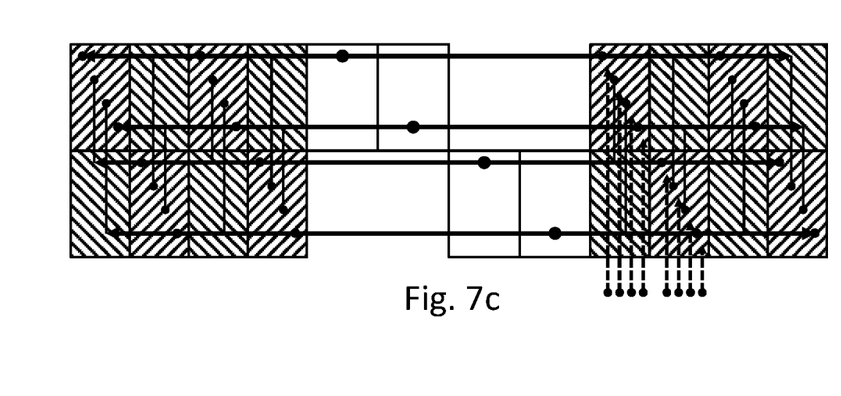

FIGS. 7a, 7b and 7c illustrate the advantages in terms of input line length of placing the data drivers in the center of the multiplexers (FIG. 7b) and interleaving the multiplexing circuits with the primary output drivers (FIG. 7c) compared to a standard arrangement (FIG. 7a), which facilitates wiring of the select drivers. Accordingly, the eight select lines have double the amount of space available compared to a non-interleaved design, where they would have to share half the space over the stacked multiplexing circuits.

Figure 8:
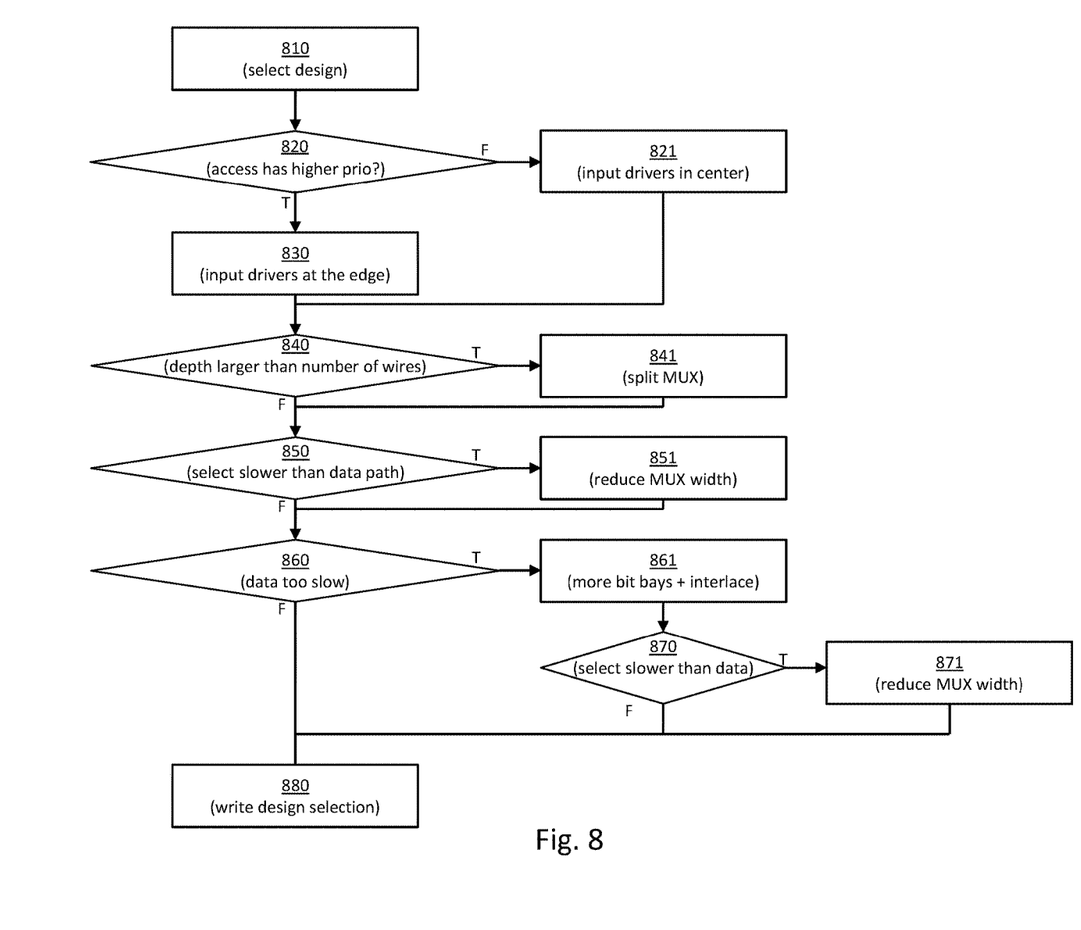
FIG. 8 shows a method for selecting a crossbar switch arrangement, in accordance with one or more aspects of the present invention.

FIG. 8 illustrates a method for selecting a semiconductor design of a crossbar switch arrangement.

In a first step 810, the parameters of the crossbar switch arrangement, e.g., number of inputs, outputs, etc., are selected. Thereafter, it is determined if the accessibility of the input drivers is more important than the timing of the input lines (step 820). If this is not the case, then the input drivers are placed in the center of the crossbar switch arrangement as shown in FIG. 4 (step 821). Otherwise, the input drivers are placed at the edge of the crossbar switch arrangement (step 830).

After steps 821 and 830 the method continues with inquiring whether the depth of the multiplexers to be used in the crossbar switch arrangement is larger than the amount of sufficiently fast input lines per bit bay area (step 840). If true, then the multiplexers are split as shown in FIGS. 2 and 3 and the outputs of the multiplexers are coupled with an OR-circuit and the method continues with step 850.

Otherwise, the method directly continues with determining if the select path is slower than the input path (step 850). If this is the case, then the number of multiplexer rows per select driver, i.e., the width, is reduced as has been shown in FIG. 5 (step 851).

After step 850 or 851 the method continues with inquiring whether the input lines are still too slow (step 860). If this is true, then in step 861, the method prescribes using two bit bay areas per multiplexer bit and interleaving the multiplexing circuits as has been explained with reference to FIG. 6. Afterwards, it is again tested if the select path is slower than the input path (step 870) and depending on the result the width is reduced (step 8710). Finally, the determined design data is stored.

Those skilled in the art will note from the above description that provided herein are semiconductor circuits which include a crossbar switch arrangement as well as methods, computer program products and systems for selecting a semiconductor design with a crossbar switch arrangement.

For instance, a semiconductor circuit is provided including a crossbar switch arrangement. The crossbar switch arrangement includes at least one multiplexer. An output of the multiplexer corresponds to an output of the crossbar switch arrangement. A set of input lines is connected to data inputs of the multiplexer and the input lines extend along a first direction of the semiconductor circuit. A set of select lines are connected to select inputs of the multiplexer and the select lines extend along a second direction of the semiconductor circuit. The second direction differs from the first direction. The multiplexer includes at least one multiplexing circuit for generating a multiplexed signal from signals present at the input lines and at least one primary output driver for generating an output signal from the multiplexed signal.

In one embodiment of the semiconductor circuit, the crossbar switch arrangement includes multiple bit bay areas located next to each other within the switch arrangement, a single bit bay area includes two power supply rails and the multiplexer comprises multiple multiplexer areas, such as two multiplexer areas, located in adjacent bit bay areas.

Another embodiment of the semiconductor circuit prescribes that one multiplexer area includes the primary output driver and a remaining multiplexer area includes the multiplexing circuit.

According to a further embodiment of the semiconductor circuit, the crossbar switch arrangement includes multiple multiplexers, and the multiplexer areas including the multiplexing circuit of neighboring multiplexers are located spaced apart from each other.

In an additional embodiment of the semiconductor circuit, the crossbar switch arrangement includes at least one input driver for driving one of the input lines, the input driver being located in an inner area of the crossbar switch arrangement and the multiplexer being located at an outer area of the crossbar switch arrangement.

In a further aspect, a method is provided for selecting a semiconductor design of a crossbar switch arrangement including at least one multiplexer, an output of which corresponds to an output of the crossbar switch arrangement, wherein the multiplexer includes at least one multiplexing circuit for generating a multiplexed signal from signals present on input lines and at least one primary output driver for generating an output signal from the multiplexed signal, wherein the method includes connecting a set of input lines to the data inputs of the multiplexer, the input lines extending along a first direction of the semiconductor circuits; and connecting a set of select lines to select inputs of the multiplexer, the select lines extending along a second direction of the semiconductor circuit, wherein the second direction differs from the first direction.

According to another aspect, a method is provided for selecting a semiconductor design of a crossbar switch arrangement including at least one multiplexer, an output of which corresponds to an output of the crossbar switch arrangement, wherein the switch arrangement includes multiple bit bay areas located next to each other within the switch arrangement, a single bit bay area including two power supply rails. The method includes placing an input driver of the crossbar switch arrangement for driving an input line connected to a data input of the multiplexer in an inner area of the crossbar switch arrangement; and placing the multiplexer such that the multiplexer includes multiple multiplexer areas, such as two multiplexer areas, located in adjacent bit bay areas.

In an embodiment of the method, the crossbar switch arrangement includes multiple multiplexers and the method includes placing the multiplexers such that the multiplexer areas including the multiplexing circuit of neighboring multiplexers are located spaced apart from each other.

In another embodiment, a computer program product is provided, the computer program product being programmed for executing a method such as described herein when executed on a programmable computer. The computer program product may include a storage medium for storing the program, such as semiconductor storage (Flash, RAM, etc.) or magnetic or optical mass storage devices (optical discs, hard discs, etc.).

In one or more other aspects, a system is provided for selecting a semiconductor design. The system includes a memory, and a processor communicatively coupled to the memory, wherein the system performs a method including obtaining a crossbar switch arrangement including at least one multiplexer, an output which corresponds to an output of the crossbar switch arrangement, where the multiplexer includes at least one multiplexing circuit for generating a multiplexed signal from signals present on input lines and at least one primary output driver for generating an output signal from the multiplexed signal. Further, the system implements a method which includes connecting a set of input lines to the data inputs of the multiplexer, the input lines extending along a first direction of the semiconductor circuits, and connecting a set of selected lines to select inputs of the multiplexer, the select lines extending along a second direction of the semiconductor circuit, where the second direction differs from the first direction.

In an embodiment of the system, the switch arrangement includes multiple bit bay areas located next to each other within the switch arrangement, with a single bit bay area including multiple power supply rails, such as two power supply rails, and the method further includes placing the multiplexer in multiple multiplexer areas located in adjacent bit bay areas. In one or more further embodiments, the system-implemented method may further include placing the primary output driver in one of the multiplexer areas, and placing the multiplexing circuit in at least one of the remaining multiplex areas.

In another embodiment, the crossbar switch arrangement may include multiple multiplexers, and the method may further include placing the multiplexer such that the multiplexer areas including the multiplexing circuit of neighboring multiplexers are located spaced apart from each other.

In one or more further embodiments, the crossbar switch arrangement includes at least one input driver for driving one of the input lines, and the system implemented method further includes placing the input driver in an inner area of the crossbar switch arrangement. Additionally, the method may include placing the multiplexer in an outer area of the crossbar switch arrangement.

An exemplary embodiment of a computing environment which may implement one or more aspects of the present invention is described below with reference to FIG. 9.

Figure 9:
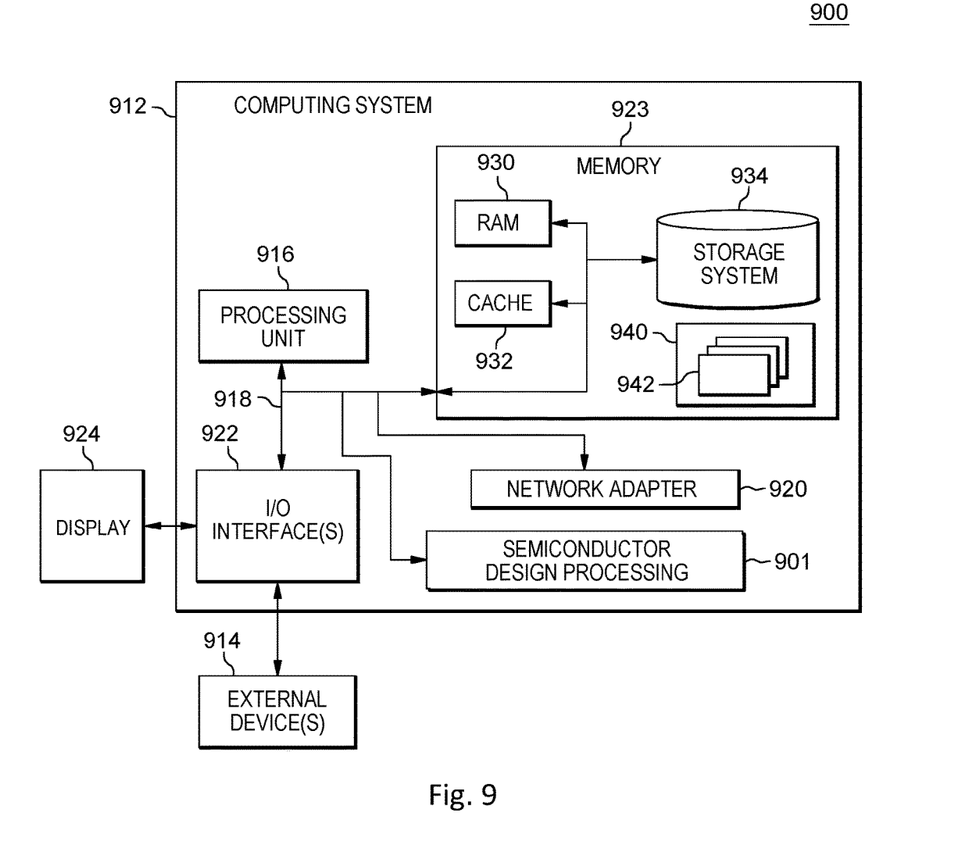
FIG. 9 depicts one embodiment of a computing system which may implement or facilitate implementing automated design processing, in accordance with one or more aspects of the present invention.

By way of example, FIG. 9 depicts one embodiment of a computing environment 900, which includes a computing system 912. Examples of well-known computing systems, environments, and/or configurations that may be suitable for use with computer system 912 include, but are not limited to, a server, a desktop computer, a work station, a wireless computer, a handheld or laptop computer or device, a mobile phone, a programmable consumer electronic device, a tablet, a personal digital assistant (PDA), and the like.

Computing system 912 may be described in the general context of computer system-executable instructions, such as program modules, being executed by a computer system. Generally, program modules may include routines, programs, objects, components, logic, data structures, and so on that perform particular tasks or implement particular abstract data types.

As depicted in FIG. 9, computing system 912, is shown in the form of a general-purpose computing device. The components of computing system 912 may include, but are not limited to, one or more processors or processing units 916, a system memory 923, and a bus 918 that couples various system components including system memory 923 to processor 916.

In one embodiment, processor 916 may be based on the z/Architecture® offered by International Business Machines Corporation, or other architectures offered by International Business Machines Corporation or other companies. z/Architecture® is a registered trademark of International Business Machines Corporation, Armonk, N.Y., USA. One embodiment of the z/Architecture® is described in "z/Architecture® Principles of Operation," IBM Publication No. SA22-7832-10, March 2015, which is hereby incorporated herein by reference in its entirety.

In other examples, it may be based on other architectures, such as the Power Architecture offered by International Business Machines Corporation. One embodiment of the Power Architecture is described in "Power ISA™ Version 2.07B," International Business Machines Corporation, Apr. 9, 2015, which is hereby incorporated herein by reference in its entirety. POWER ARCHITECTURE is a registered trademark of International Business Machines Corporation, Armonk, N.Y., USA. Other names used herein may be registered trademarks, trademarks, or product names of International Business Machines Corporation or other companies.

Bus 918 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus.

Computing system 912 may include a variety of computer system readable media. Such media may be any available media that is accessible by computing system 912, and it includes both volatile and non-volatile media, removable and non-removable media.

System memory 923 can include computer system readable media in the form of volatile memory, such as random access memory (RAM) 930 and/or cache memory 932. Computing system 912 may further include other removable/non-removable, volatile/non-volatile computer system storage media. By way of example only, storage system 934 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media could be provided. In such instances, each can be connected to bus 918 by one or more data media interfaces. As described below, memory 923 may include at least one program product having a set (e.g., at least one) of program modules that are configured to carry out the functions of embodiments of the invention.

Program/utility 940, having a set (at least one) of program modules 942, may be stored in memory 932 by way of example, and not limitation, as well as an operating system, one or more application programs, other program modules, and program data. Each of the operating system, one or more application programs, other program modules, and program data or some combination thereof, may include an implementation of a networking environment. Program modules 942 generally carry out the functions and/or methodologies of embodiments of the invention as described herein. Alternatively, a semiconductor design processing module, logic, etc., 901 may be provided within computing environment 912.

Computing system 912 may also communicate with one or more external devices 914 such as a keyboard, a pointing device, a display 924, etc.; one or more devices that enable a user to interact with computing system 912; and/or any devices (e.g., network card, modem, etc.) that enable computing system 912 to communicate with one or more other computing devices. Such communication can occur via Input/Output (I/O) interfaces 922. Still yet, computing system 912 can communicate with one or more networks such as a local area network (LAN), a general wide area network (WAN), and/or a public network (e.g., the Internet) via network adapter 920. As depicted, network adapter 920 communicates with the other components of computing system, 912, via bus 918. It should be understood that although not shown, other hardware and/or software components could be used in conjunction with computing system 912. Examples, include, but are not limited to: microcode, device drivers, redundant processing units, external disk drive arrays, RAID systems, tape drives, and data archival storage systems, etc.

The method may be implemented using a computer program product. The computer program product may include a computer readable storage medium (or media) having computer readable program instructions thereon for causing a processor to carry out aspects of the method.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry.

Aspects are described herein with reference to flowchart illustrations and/or block diagrams of methods. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. A semiconductor circuit comprising:
    a crossbar switch arrangement, the crossbar switch arrangement comprising:
        at least two separate groups of multiplexers, an output of which corresponding to an output of the crossbar switch arrangement;
        a set of input lines connected to data inputs of the at least two separate groups of multiplexers, the input lines extending along a first direction of the semiconductor circuit;
        a set of select lines connected to select inputs of the at least two separate groups of multiplexers, the select lines extending along a second direction of the semiconductor circuit, wherein the second direction differs from the first direction;
        a plurality of select drivers for driving the select lines, the plurality of select drivers being in between one group of multiplexers and another group of multiplexers of the at least two separate groups of multiplexers; and
        wherein the at least two separate groups of multiplexers comprise at least one multiplexing circuit for generating a multiplexed signal from signals present at the input lines and at least one primary output driver for generating an output signal from the multiplexed signal.

2. The semiconductor circuit according to claim 1, wherein the crossbar switch arrangement comprises multiple bit bay areas located next to each other within the switch arrangement, a single bit bay area including multiple power supply rails, and wherein the multiplexer comprises multiple multiplexer areas located in adjacent bit bay areas.

3. The semiconductor circuit according to claim 2, wherein the multiple power supply rails comprise two power supply rails.

4. The semiconductor circuit according to claim 2, wherein one of said multiple multiplexer areas comprise the primary output driver and remaining multiplexer areas include the multiplexing circuit.

5. The semiconductor circuit according to claim 4, wherein the crossbar switch arrangement comprises multiple multiplexers and wherein multiplexer areas including the multiplexing circuit of neighboring multiplexers are located spaced apart from each other.

6. The semiconductor circuit according to claim 1, wherein the crossbar switch arrangement comprises at least one input driver for driving one of the input lines, the input driver being located in an inner area of the crossbar switch arrangement.

7. The semiconductor circuit according to claim 6, wherein the multiplexer is located at an outer area of the crossbar switch arrangement.

8. A method for facilitating fabrication of a semiconductor circuit comprising:
    fabricating a crossbar switch arrangement, the fabricating comprising:

providing at least two separate groups of multiplexers, an output of which corresponding to an output of the crossbar switch arrangement;

connecting a set of input lines to data inputs of the at least two separate groups of multiplexers, the input lines extending along a first direction of the semiconductor circuit;

connecting a set of select lines to select inputs of the at least two separate groups of multiplexers, the select lines extending along a second direction of the semiconductor circuit, wherein the second direction differs from the first direction;

providing a plurality of select drivers for driving the select lines, the plurality of select drivers being in between one group of multiplexers and another group of multiplexers of the at least two separate groups of multiplexers; and wherein the at least two separate groups of multiplexers comprise at least one multiplexing circuit for generating a multiplexed signal from signals present at the input lines and at least one primary output driver for generating an output signal from the multiplexed signal.

9. The method according to claim 8, wherein the switch arrangement comprises multiple bit bay areas located next to each other within the switch arrangement, a single bit bay area including two power supply rails, the method further comprises placing the multiplexer in multiple multiplexer areas located in adjacent bit bay areas.

10. The method according to claim 9, wherein the multiple multiplexer areas are two multiplexer areas.

11. The method according to claim 9, further comprising:
placing the primary output driver in one of the multiplexer areas; and
placing the multiplexing circuit in at least one of the remaining multiplexer areas.

12. The method of claim 11, wherein the crossbar switch arrangement comprises multiple multiplexers and the method further comprises placing the multiplexers such that multiplexer areas including the multiplexing circuit of neighboring multiplexers are located spaced apart from each other.

13. The method according to claim 8, wherein the crossbar switch arrangement comprises at least one input driver for driving one of the input lines, and wherein the method further comprises:
placing the input driver in an inner area of the crossbar switch arrangement.

14. The method according to claim 13, wherein the method further comprises placing the multiplexer at an outer area of the crossbar switch arrangement.

15. A computer program product for facilitating fabrication of a semiconductor circuit, the computer program product comprising:
a computer readable storage medium having program instructions embodied therewith, the program instructions being executable by a processor to perform a method comprising:
fabricating a crossbar switch arrangement, the fabricating comprising:
providing at least two separate groups of multiplexers, an output of which corresponding to an output of the crossbar switch arrangement;

connecting a set of input lines to data inputs of the at least two separate groups of multiplexers, the input lines extending along a first direction of the semiconductor circuit;

connecting a set of select lines to select inputs of the at least two separate groups of multiplexers, the select lines extending along a second direction of the semiconductor circuit, wherein the second direction differs from the first direction;

providing a plurality of select drivers for driving the select lines, the plurality of select drivers being in between one group of multiplexers and another group of multiplexers of the at least two separate groups of multiplexers; and wherein the at least two separate groups of multiplexers comprise at least one multiplexing circuit for generating a multiplexed signal from signals present at the input lines and at least one primary output driver for generating an output signal from the multiplexed signal.

16. The computer program product of claim 15, wherein the switch arrangement comprises multiple bit bay areas located next to each other within the switch arrangement, a single bit bay area including two power supply rails, the method further comprises placing the multiplexer in multiple multiplexer areas, preferably two multiplexer areas, located in adjacent bit bay areas.

17. The computer program product of claim 16, further comprising:
placing the primary output driver in one of the multiplexer areas; and
placing the multiplexing circuit in at least one of the remaining multiplexer areas.

18. The computer program product of claim 17, wherein the crossbar switch arrangement comprises multiple multiplexers and the method further comprises placing the multiplexers such that multiplexer areas including the multiplexing circuit of neighboring multiplexers are located spaced apart from each other.

19. The computer program product of 15, wherein the crossbar switch arrangement comprises at least one input driver for driving one of the input lines, and wherein the method further comprises:
placing the input driver in an inner area of the crossbar switch arrangement.

20. The computer program product of claim 19, wherein the method further comprises placing the multiplexer at an outer area of the crossbar switch arrangement.

* * * * *